United States Patent
Pickett et al.

(10) Patent No.: US 9,574,135 B2
(45) Date of Patent: Feb. 21, 2017

(54) GAS PHASE ENHANCEMENT OF EMISSION COLOR QUALITY IN SOLID STATE LEDS

(71) Applicant: Nanoco Technologies Ltd., Manchester (GB)

(72) Inventors: Nigel Pickett, Manchester (GB); Nathalie Gresty, Chester (GB)

(73) Assignee: Nanoco Technologies Ltd., Manchester (GB)

(*) Notice: Subject to any disclaimer, the term of this patent is extended or adjusted under 35 U.S.C. 154(b) by 21 days.

(21) Appl. No.: 14/463,928

(22) Filed: Aug. 20, 2014

(65) Prior Publication Data
US 2015/0053916 A1   Feb. 26, 2015

Related U.S. Application Data

(60) Provisional application No. 61/868,885, filed on Aug. 22, 2013.

(51) Int. Cl.
*H01L 33/00* (2010.01)
*H01L 33/06* (2010.01)
(Continued)

(52) U.S. Cl.
CPC .......... *C09K 11/883* (2013.01); *C01B 19/007* (2013.01); *C01B 25/082* (2013.01); *C01G 9/08* (2013.01);
(Continued)

(58) Field of Classification Search
CPC ............ H01L 33/0062; H01L 33/0066; H01L 33/007; B82Y 20/00; Y10S 977/773–977/774
See application file for complete search history.

(56) References Cited

U.S. PATENT DOCUMENTS 5,936,258 A * 8/1999 Imamura ............... B82Y 10/00
257/14
6,051,849 A * 4/2000 Davis .................. H01L 21/0237
257/103
(Continued)

OTHER PUBLICATIONS

"Wavelength Engineered Luminescent Material Incorporating Colloidal Quantum Dot within a Nanoporous Gallium Nitride Matrix," Cuong Dang, Yu Zhang, Joonhee Lee, Jung Han, Arto Nurmikko, Craig Breen, Jonathan S. Steckel, Brown University and Yale University, USA 2011.*
(Continued)

*Primary Examiner* — William F Kraig
*Assistant Examiner* — Maliheh Malek
(74) *Attorney, Agent, or Firm* — Blank Rome, LLP

(57) ABSTRACT

Light-emitting materials are made from a porous light-emitting semiconductor having quantum dots (QDs) disposed within the pores. According to some embodiments, the QDs have diameters that are essentially equal in size to the width of the pores. The QDs are formed in the pores by exposing the porous semiconductor to gaseous QD precursor compounds, which react within the pores to yield QDs. According to certain embodiments, the pore size limits the size of the QDs produced by the gas-phase reactions. The QDs absorb light emitted by the light-emitting semiconductor material and reemit light at a longer wavelength than the absorbed light, thereby "down-converting" light from the semiconductor material.

11 Claims, 6 Drawing Sheets

(51) Int. Cl.
  *C09K 11/88* (2006.01)
  *C09K 11/02* (2006.01)
  *C09K 11/56* (2006.01)
  *C09K 11/70* (2006.01)
  *C01B 19/00* (2006.01)
  *C01B 25/08* (2006.01)
  *C01G 9/08* (2006.01)
  *C01G 11/02* (2006.01)
  *H01L 33/30* (2010.01)
  *H01L 33/08* (2010.01)

(52) U.S. Cl.
  CPC .............. *C01G 11/02* (2013.01); *C09K 11/02* (2013.01); *C09K 11/565* (2013.01); *C09K 11/70* (2013.01); *C01P 2002/84* (2013.01); *C01P 2004/64* (2013.01); *H01L 33/08* (2013.01)

(56) References Cited

U.S. PATENT DOCUMENTS

| | | | | |
|---|---|---|---|---|
| 6,121,121 A * | 9/2000 | Koide | H01L 21/0237 | 257/E21.112 |
| 6,130,142 A * | 10/2000 | Westwater | H01L 21/02639 | 257/E21.09 |
| 6,177,688 B1 * | 1/2001 | Linthicum | C30B 25/02 | 257/190 |
| 6,214,738 B1 * | 4/2001 | Aiba | B82Y 15/00 | 438/707 |
| 6,261,929 B1 * | 7/2001 | Gehrke | H01L 21/0237 | 257/E21.123 |
| 6,306,734 B1 * | 10/2001 | Givargizov | C30B 11/12 | 257/72 |
| 6,348,096 B1 * | 2/2002 | Sunakawa | C30B 25/02 | 117/88 |
| 6,521,514 B1 * | 2/2003 | Gehrke | H01L 21/0242 | 257/E21.113 |
| 6,545,300 B2 * | 4/2003 | Gehrke | H01L 21/0242 | 257/190 |
| 6,596,079 B1 * | 7/2003 | Vaudo | C30B 23/00 | 117/101 |
| 6,596,377 B1 * | 7/2003 | Hersee | C30B 25/02 | 428/195.1 |
| 6,692,568 B2 * | 2/2004 | Cuomo | C23C 14/0063 | 117/106 |
| 6,709,513 B2 * | 3/2004 | Fukunaga | C30B 25/02 | 117/106 |
| 6,835,246 B2 * | 12/2004 | Zaidi | C30B 25/18 | 117/106 |
| 6,844,569 B1 * | 1/2005 | Lee | C30B 29/605 | 257/103 |
| 6,897,483 B2 * | 5/2005 | Zheleva | H01L 21/02378 | 257/77 |
| 6,901,194 B2 * | 5/2005 | Charlton | B82Y 20/00 | 385/11 |
| 6,958,254 B2 * | 10/2005 | Seifert | C30B 23/02 | 257/11 |
| 7,052,979 B2 * | 5/2006 | Nagai | C30B 25/02 | 257/E21.119 |
| 7,115,486 B2 * | 10/2006 | Tadatomo | C30B 25/02 | 257/E21.131 |
| 7,176,497 B2 * | 2/2007 | Koide | C30B 25/02 | 257/103 |
| 7,361,522 B2 * | 4/2008 | Wang | H01L 21/0242 | 438/46 |
| 7,521,274 B2 * | 4/2009 | Hersee | B82Y 20/00 | 438/41 |
| 7,670,933 B1 * | 3/2010 | Wang | C30B 25/005 | 117/104 |
| 7,772,595 B2 * | 8/2010 | Guo | C30B 25/02 | 257/103 |
| 7,850,941 B2 * | 12/2010 | Tsakalakos | C30B 11/12 | 423/445 R |
| 8,118,934 B2 * | 2/2012 | Wang | B82Y 30/00 | 117/101 |
| 8,618,561 B2 * | 12/2013 | Coe-Sullivan | B82Y 10/00 | 257/86 |
| 8,653,500 B1 | 2/2014 | Subramania et al. | | |
| 9,142,621 B2 * | 9/2015 | Tun | H01L 21/266 | |
| 9,419,249 B2 * | 8/2016 | Yamaguchi | G02B 5/18 | |
| 2001/0055881 A1 | 12/2001 | Laermer | H01L 21/7806 | 438/694 |
| 2002/0013036 A1 * | 1/2002 | Gehrke | H01L 21/0237 | 438/462 |
| 2002/0013042 A1 * | 1/2002 | Morkoc | B82Y 10/00 | 438/604 |
| 2002/0043208 A1 * | 4/2002 | Biwa | C30B 25/02 | 117/94 |
| 2002/0109134 A1 * | 8/2002 | Iwasaki | B82Y 10/00 | 257/13 |
| 2002/0111044 A1 * | 8/2002 | Linthicum | C30B 25/02 | 438/797 |
| 2003/0006211 A1 * | 1/2003 | Fukunaga | C30B 25/02 | 216/2 |
| 2003/0178634 A1 * | 9/2003 | Koide | C30B 25/02 | 257/103 |
| 2004/0077156 A1 * | 4/2004 | Tsakalakos | H01L 21/0237 | 438/479 |
| 2004/0123796 A1 * | 7/2004 | Nagai | C30B 25/02 | 117/103 |
| 2004/0124409 A1 * | 7/2004 | Ebe | B82Y 10/00 | 257/14 |
| 2004/0137732 A1 * | 7/2004 | Frayssinet | C30B 25/02 | 438/689 |
| 2004/0157358 A1 * | 8/2004 | Hiramatsu | C30B 25/02 | 438/93 |
| 2004/0206299 A1 * | 10/2004 | Tadatomo | C30B 25/02 | 117/84 |
| 2004/0251519 A1 * | 12/2004 | Sugahara | H01L 21/0265 | 257/615 |
| 2005/0061986 A1 * | 3/2005 | Kardynal | B82Y 20/00 | 250/370.01 |
| 2005/0199886 A1 * | 9/2005 | Yi | H01L 21/02381 | 257/79 |
| 2005/0258419 A1 * | 11/2005 | Sankaran | B82Y 20/00 | 257/40 |
| 2006/0091408 A1 * | 5/2006 | Kim | H01L 21/02381 | 257/94 |
| 2006/0157103 A1 * | 7/2006 | Sheats | H01L 27/3204 | 136/244 |
| 2006/0210083 A1 * | 9/2006 | Takemoto | B82Y 10/00 | 380/278 |
| 2006/0244164 A1 * | 11/2006 | Didenko | B01J 6/008 | 264/14 |
| 2006/0246722 A1 * | 11/2006 | Speck | H01L 21/2654 | 438/689 |
| 2006/0269688 A1 * | 11/2006 | Sadewasser | C23C 16/047 | 427/561 |
| 2006/0270087 A1 * | 11/2006 | Imer | C30B 25/02 | 438/46 |
| 2006/0270200 A1 * | 11/2006 | Shibata | C30B 25/04 | 438/481 |
| 2006/0270201 A1 * | 11/2006 | Chua | C30B 25/02 | 438/481 |
| 2007/0152353 A1 * | 7/2007 | Park | B82Y 20/00 | 257/88 |
| 2007/0181906 A1 * | 8/2007 | Chik | B82Y 20/00 | 257/103 |
| 2007/0197003 A1 * | 8/2007 | Yen | B01J 19/0093 | 438/479 |
| 2007/0224713 A1 * | 9/2007 | Han | H01L 24/95 | 438/26 |
| 2008/0054292 A1 * | 3/2008 | Guo | C30B 25/02 | 257/103 |
| 2008/0260941 A1 * | 10/2008 | Jin | B01J 35/0013 | 427/126.4 |
| 2008/0305568 A1 * | 12/2008 | Huang | B82Y 20/00 | 438/34 |

(56) References Cited

U.S. PATENT DOCUMENTS

| | | | |
|---|---|---|---|
| 2009/0056628 A1* | 3/2009 | Kortshagen | B82Y 30/00 118/718 |
| 2009/0057662 A1* | 3/2009 | Brazis | H01L 21/02422 257/43 |
| 2009/0079034 A1* | 3/2009 | Wang | H01L 21/02609 257/615 |
| 2009/0079035 A1* | 3/2009 | Wang | B82Y 30/00 257/615 |
| 2009/0152664 A1* | 6/2009 | Klem | H01L 27/14603 257/440 |
| 2009/0174038 A1* | 7/2009 | Wang | C30B 25/00 257/618 |
| 2009/0243043 A1* | 10/2009 | Wang | C30B 23/007 257/615 |
| 2009/0263925 A1* | 10/2009 | Kunisato | H01L 33/0079 438/42 |
| 2009/0306394 A1* | 12/2009 | Torimoto | B22F 9/12 548/101 |
| 2010/0006148 A1* | 1/2010 | Zheng | H01L 51/42 136/256 |
| 2010/0035416 A1* | 2/2010 | Chen | H01L 21/02381 438/481 |
| 2010/0065889 A1* | 3/2010 | Braun | H01C 7/10 257/201 |
| 2010/0075468 A1* | 3/2010 | Dubrow | H01L 21/02381 438/149 |
| 2010/0139772 A1 | 6/2010 | Frank et al. | |
| 2010/0140745 A1* | 6/2010 | Khan | C30B 25/04 257/615 |
| 2010/0187501 A1* | 7/2010 | Toda | B82Y 20/00 257/21 |
| 2010/0197068 A1* | 8/2010 | Poon | H01L 31/02246 438/63 |
| 2010/0237322 A1* | 9/2010 | Okada | H01L 51/5012 257/13 |
| 2010/0283064 A1* | 11/2010 | Samuelson | B82Y 20/00 257/88 |
| 2010/0288341 A1* | 11/2010 | Kim | B82Y 20/00 136/252 |
| 2010/0307705 A1* | 12/2010 | Rahm | B42D 25/00 162/140 |
| 2011/0068322 A1* | 3/2011 | Pickett | C09K 11/02 257/13 |
| 2011/0079767 A1* | 4/2011 | Senes | B82Y 10/00 257/13 |
| 2011/0127490 A1* | 6/2011 | Mi | B82Y 10/00 257/13 |
| 2011/0194304 A1* | 8/2011 | Han | D01D 5/0023 362/555 |
| 2011/0205543 A1* | 8/2011 | Offermans | G01N 21/554 356/445 |
| 2011/0284819 A1* | 11/2011 | Kang | B82Y 20/00 257/9 |
| 2011/0308590 A1* | 12/2011 | Asami | B82Y 10/00 136/255 |
| 2012/0017825 A1* | 1/2012 | D'Evelyn | C30B 9/08 117/58 |
| 2012/0032138 A1* | 2/2012 | Kim | H01L 51/502 257/13 |
| 2012/0049151 A1* | 3/2012 | Zhang | H01L 33/007 257/13 |
| 2012/0080361 A1* | 4/2012 | Walavalkar | B01D 67/0062 209/235 |
| 2012/0085400 A1* | 4/2012 | Arena | H01L 31/04 136/255 |
| 2012/0125781 A1* | 5/2012 | Zhang | C25B 11/0405 205/340 |
| 2012/0129322 A1* | 5/2012 | Meissner | H01L 31/0326 438/478 |
| 2012/0205613 A1* | 8/2012 | Mi | B82Y 10/00 257/9 |
| 2012/0311925 A1* | 12/2012 | Aikala | A01G 7/045 47/1.41 |
| 2013/0098288 A1* | 4/2013 | Samuelson | B82Y 30/00 117/86 |
| 2013/0140518 A1* | 6/2013 | Jain | G01N 27/4145 257/12 |
| 2013/0146838 A1* | 6/2013 | Ku | H01L 31/03521 257/13 |
| 2013/0240348 A1* | 9/2013 | Mi | H01L 31/03044 204/157.5 |
| 2013/0240829 A1* | 9/2013 | Kuramachi | H01L 21/02458 257/9 |
| 2013/0270517 A1* | 10/2013 | Nozawa | H01L 33/04 257/13 |
| 2013/0314698 A1* | 11/2013 | Pickett | G01N 21/91 356/72 |
| 2014/0011013 A1* | 1/2014 | Jin | B05D 5/08 428/297.4 |
| 2014/0054540 A1* | 2/2014 | Zhou | H01L 31/03520 257/9 |
| 2014/0098515 A1* | 4/2014 | Pickett | G09F 13/02 362/23.13 |
| 2014/0110665 A1* | 4/2014 | Zhang | H01L 51/5092 257/13 |
| 2014/0182668 A1* | 7/2014 | Pacifici | H01L 31/03521 136/255 |
| 2014/0185640 A1* | 7/2014 | Jain | B82Y 20/00 372/45.011 |
| 2014/0264196 A1* | 9/2014 | Werner | C23C 16/30 252/519.34 |
| 2014/0306252 A1* | 10/2014 | Chen | H01L 33/58 257/98 |
| 2014/0340912 A1* | 11/2014 | Kang | C23C 28/00 362/351 |
| 2014/0353579 A1* | 12/2014 | Greco | G01N 33/588 257/13 |
| 2014/0374699 A1* | 12/2014 | Cho | H01L 27/305 257/13 |
| 2015/0001588 A1* | 1/2015 | Gunji | H01L 21/02587 257/200 |
| 2015/0021549 A1* | 1/2015 | Zhang | H01L 33/06 257/13 |
| 2015/0076468 A1* | 3/2015 | Yamaguchi | G02B 1/118 257/40 |
| 2015/0076469 A1* | 3/2015 | Ikemizu | C09K 11/88 257/40 |
| 2015/0171269 A1* | 6/2015 | Kim | H01L 33/005 257/13 |
| 2015/0260373 A1* | 9/2015 | Li | C09K 11/02 362/355 |
| 2015/0263225 A1* | 9/2015 | Lee | H01L 33/06 257/13 |
| 2015/0280401 A1* | 10/2015 | Lee | H01S 5/1046 372/45.01 |
| 2015/0287927 A1* | 10/2015 | Okubo | B82Y 20/00 257/40 |
| 2015/0320895 A1* | 11/2015 | Sun | A61N 5/1014 600/8 |
| 2015/0364545 A1* | 12/2015 | Heo | H01L 29/1033 257/24 |
| 2015/0380653 A1* | 12/2015 | Liu | H01L 51/0036 257/13 |
| 2016/0084476 A1* | 3/2016 | Koole | F21V 9/16 362/84 |

OTHER PUBLICATIONS

"A Wafer-Level Integrated White-Light-Emitting Diode Incorporating Colloidal Quantum Dots as a Nanocomposite Material," Cuong Dang, Joonhee Lee, Yu Zhang, Jung Han, Craig Breen, Jonathan S. Steckel, Seth Coe-Sullivan, Nurmikko, Germany 2012 Luminescent and Arto Nurmikko, Germany 2012.*

"Multicolor, High Efficiency, Nanotextured LEDs," Professor Jung Han (Yale University) and Professor Arto V. Nurmikko (Brown University), Feb. 10, 2012.*

(56) References Cited

OTHER PUBLICATIONS

"GaN Nanopore Arrays: Fabrication and Characterization," Yadong Wang, Chen Peng, Melissa Sander, Soo Jin Chua, Clifton G. Jr. Fonstad, Singapore and MIT USA, 2003.*

"Wafer-Level Integrated White-Light-Emitting Diode Incorporating Colloidal Quantum Dots as a Nanocomposite Luminescent Material," Dang et al., Advance Materials, USA, 2012.*

Dang et al., A Wafer-Level Integrated White-Light-Emitting Diode Incorporating Colloidal Quantum Dots as a Nanocomposite Luminescent Material, Mater Views, Advanced Materials, 2012, 24, pp. 5915-5918, © 2012 Wiley-VCH Verlag GmbH & Co. KGaA, Weinheim.

Dang et al., A Wavelength engineered emitter incorporating CdSe-based colloidal quantum dots into nonporous InGaN/GaN multiple quantum well matrix, Phys. Status Solidi C 8, No. 7-8, pp. 2337-2339 (2011)/DOI 10.1002/pssc.201001185, © WILEY-VCH Verlag GmbH & Co. KGaA, Weinheim.

Pickett et al., Effect of pyridine upon gas-phase reactions between H2S and Me2Cd; control of nanpparticle growth, J. Mater. Chem., 1996 6(3), pp. 507-509, School of Chemistry, University of St. Andrews, St. Andrews, Fife, Scotland, UK KY16 9ST.

Pickett et al., Gas-phase synthesis of nanoparticles of group 12 chalcogenides, . Mater. Chem., 1997 7(9), pp. 1857-1865, School of Chemistry, University of St. Andrews, St. Andrews, Fife, Scotland, UK KY16 9ST, Department of Chemistry, Glasgow University, Glasgow, Scotland, UK G12 8QQ.

Haggata et al., Synthesis and characterization of II-VI semiconductor nanoparticulates by the reaction of a metal alkyl polymer adduct with hydrogen sulfide, . Mater. Chem., 1996 6(11), pp. 1771-1780, School of Chemistry, University of St. Andrews, St. Andrews, Fife, Scotland, UK KY16 9ST, Department of Chemistry, Glasgow University, Glasgow, Scotland, UK G12 8QQ.

Haggata et al., Control of average size and size distribution in as-grown nanoparticle polymer composites of MS2 (M=Cd or Zn), J. Mater. Chem., 1997, 7 (10), pp. 1969-1975, School of Chemistry, University of St. Andrews, St. Andrews, Fife, Scotland, UK KY16 9ST, Department of Chemistry, Glasgow University, Glasgow, Scotland, UK G12 8QQ.

* cited by examiner

GAS PHASE ENHANCEMENT OF EMISSION COLOR QUALITY IN SOLID STATE LEDS

FIELD OF THE INVENTION

This application relates to gas phase synthesis of nanoparticle-based materials. More particularly, but not exclusively, it relates to down-converting light from a light emitting diode (LED) by synthesizing QDs within pores etched into the LED.

BACKGROUND

There has been substantial interest in exploiting compound semiconductors having particle dimensions on the order of 2-50 nm, often referred to as quantum dots (QDs), nanoparticles, and/or nanocrystals. These materials have high commercial interest due to their size-tunable electronic properties, which can be exploited in a broad range of commercial applications. Such applications include optical and electronic devices, biological labeling, photovoltaics, catalysis, biological imaging, light emitting diodes (LEDs), general space lighting, and electroluminescent displays.

Well-known QDs are nanoparticles of metal chalcogenides (e.g, CdSe or ZnS). Less studied nanoparticles include III-V materials, such as InP, and including compositionally graded and alloyed dots. QDs typically range from 2 to 10 nanometers in diameter (about the width of 50 atoms), but may be larger, for example up to about 100 nanometers. Because of their small size, QDs display unique optical and electrical properties that are different in character to those of the corresponding bulk material. The most immediately apparent optical property is the emission of photons under excitation. The wavelength of these photon emissions depends on the size of the QD.

The ability to precisely control QD size enables a manufacturer to determine the wavelength of its emission, which in turn determines the color of light the human eye perceives. QDs may therefore be "tuned" during production to emit a desired light color. The ability to control or "tune" the emission from the QD by changing its core size is called the "size quantization effect". The smaller the QD, the higher the energy, i.e. the more "blue" its emission. Likewise, larger QDs emit light more toward the electromagnetic spectrum's red end. QDs may even be tuned beyond visible spectrum, into the infrared or ultra-violet bands. Once synthesized, QDs are typically either in powder or solution form.

A particularly attractive application for QDs is in the development of next generation LEDs. LEDs are becoming increasingly important in modern day life and it's predicted that they have the potential to become a major target for QD applications. QDs can enhance LEDs in a number of areas, including automobile lighting, traffic signals, general lighting, liquid crystal display (LCD) backlight units (BLUs), and display screens.

Currently, LED devices are typically made from inorganic solid-state compound semiconductors, such as GaN (blue), AlGaAs (red), AlGaInP (orange-yellow-green), and AlGaInN (green-blue). Each of these materials emit a single color of light, as indicated. As white light is a mixture of colors in the spectrum, solid-state LEDs that emit white light cannot be produced using a single solid-state material. Moreover, it is difficult to produce "pure" colors by combining solid-state LEDs that emit at different frequencies. At present, the primary method of producing white light or a mixture of colors from a single LED is to "down-convert" light emitted from the LED using a phosphorescent material on top of the solid-state LED. In such a configuration, the light from the LED (the "primary light") is absorbed by the phosphorescent material and re-emitted at a second, lower frequency (the "secondary light"). In other words, the phosphorescent materials down-converts the primary light to secondary light. The total light emitted from the system is a combination of the primary and secondary light. White LEDs produced by phosphor down-conversion cost less and are simpler to fabricate than combinations of solid-state red-green-blue LEDs. Unfortunately, however, conventional phosphor technology produces light with poor color rendering (i.e. a color rendering index (CRI)<75).

QDs are a promising alternative to conventional phosphor technology. Their emission wavelength can be tuned by manipulating nanoparticle size. Also, so long as the QDs are monodispersed, they exhibit strong absorption properties, narrow emission bandwidth, and low scattering. Rudimentary QD-based light-emitting devices have been manufactured by embedding coloidally produced QDs in an optically transparent (or sufficiently transparent) LED encapsulation medium, such a silicone or an acrylate, which is then placed on top of a solid-state LED. Thus, the light produced from the LED package is a combination of the LED primary light and the secondary light emitted from the QD material.

However, such systems are complicated by the nature of current LED encapsulants. For example, QDs can agglomerate when formulated into current LED encapsulants, thereby reducing their optical performance. Furthermore, even after the QDs have been incorporated into the LED encapsulant, oxygen can still migrate through the encapsulant to the surfaces of the QDs, which can lead to photo-oxidation and, as a result, a drop in quantum yield (QY).

Thus, there is need in the art for a fast and inexpensive method that can reliably down-convert an LED.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DESCRIPTION

Figure 1A:
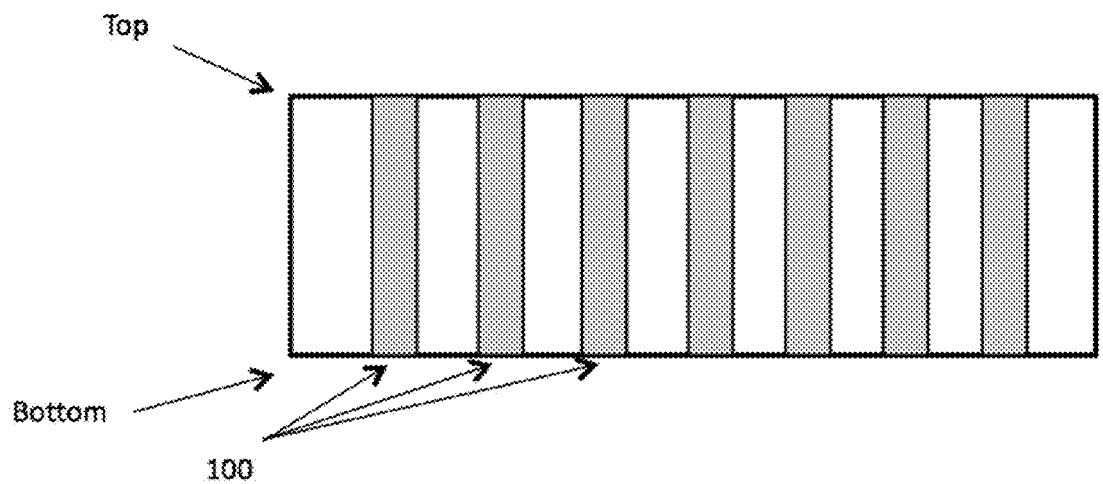
FIGS. 1A-1C illustrate pores etched into a semiconductor material.

It should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting. It should further be understood that any one of the described features may be used separately or in combination with other features. Other invented systems, methods, features, and advantages will be or become apparent to one with skill in the art upon examining the drawings and the detailed description herein. It is intended that all such additional systems, methods, features, and advantages be protected by the accompanying claims.

The present disclosure generally relates to light emitting devices using a solid-state LED material into which pores have been etched. QDs are synthesized within those pores. When the LED material emits light (i.e., primary light) the QDs absorb some of that light and reemit light having a color determined by the size of the QDs (i.e., secondary light). The light emitted from the light-emitting device therefore includes a combination of the primary and secondary light. Various combinations of LED materials and QD materials and sizes can be used to obtain white light or to obtain other blends of light.

According to some embodiments, the QD materials are synthesized within the pores of the LED material via gas phase reactions. As explained in more detail below, the gas phase QD precursor material diffuse into the pores of the LED material where they react to form QDs. The size of the QDs may be limited by the size of the pores in which the QDs form. In this way, the pores may be thought of as providing a "template" for QD formation. Since the color of light that a QD emits depends on the size of the QD, the color of emitted light can be tuned by controlling the size of the pores in which the QDs form.

Generally, any solid-state LED semiconductor material can be used. Examples include, but are not restricted to, inorganic solid-state compound semiconductors, such as GaN (blue), AlGaAs (red), AlGaInP (orange-yellow-green), AlGaInN (green-blue), or any derivatives thereof. The characteristic emission colors of each material are provided in parentheses. The examples discussed in this disclosure primarily concern GaN, as it is common to seek to down-convert light from blue-emitting GaN.

Figure 1B:
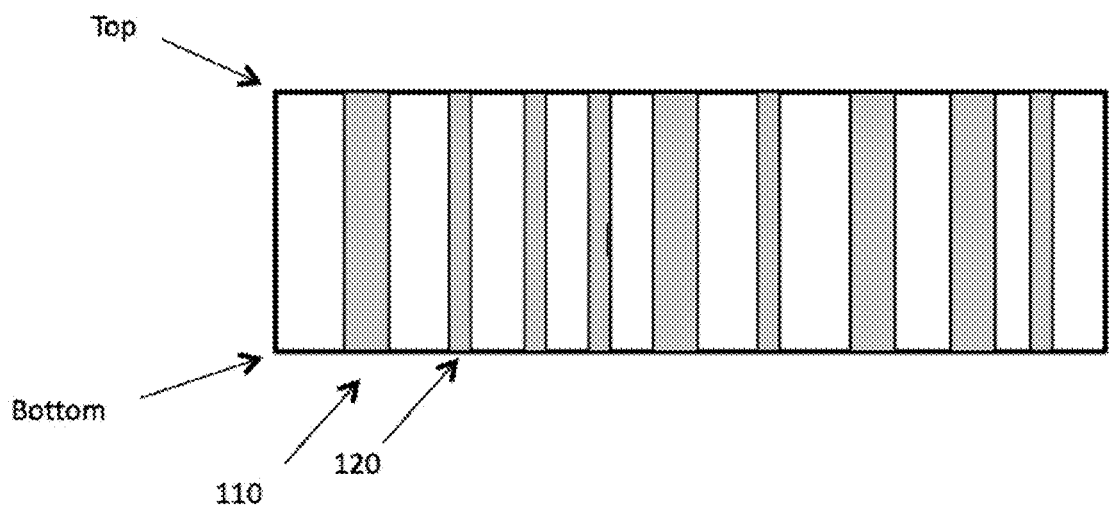

Pores can be etched in the solid-state LED semiconductor material using any means known in the art. Examples of controlled etching are contained in Cuong Dang et al., *A wavelength engineered emitter incorporating CdSe-based colloidal quantum dots into nanoporous InGaN/GaN multiple quantum well matrix*, Phys. Status Solidi, No. 7-8, 2337-339 (2011); Dang et al., *A wafer-level integrated white-light-emitting diode incorporating colloidal quantum dots as a nanocomposite luminescent material*, Adv. Materials, No. 24, 5915-18 (2012); and Chen et al., *High reflectance membrane-based distributed Bragg reflectors for GaN photonics*, App. Phys. Lett., No. 101, 221104 (2012). The reader is referred to those references for details concerning the etching of the LED semiconductor material. Generally, the LED semiconductor material is etched using an electrochemical method, for example, anodic etching in an oxalic acid electrolyte. The pore size and concentration can be controlled as a function of the applied voltage. Other methods of etching, such as acid etching and/or inductively coupled plasma-reactive ion (ICP-RI) etching may be used. It is found that the etching technique does not impair the semiconductor material's carrier transport and recombination capability. FIGS. 1A-1B, by way of example only, illustrate semiconductor materials having etched pores.

In some embodiments, the etching technique produces pores having approximately the same diameter. For example, referring to FIG. 1A, the pores 100 can be etched to a target pore size. In one embodiment, the target pore size may be between approximately 2 nm and 10 nm. The pore size can be tuned to a uniform diameter that accommodates growth of both red-emitting QDs and green-emitting QDs. For example, the pore size can be tuned to a single diameter that accommodates growth of red-emitting Group III-V based QDs (e.g. InP, and including graded dots and alloys), and green-emitting CdSe QDs. In one embodiment, a semiconductor material for a blue-LED (e.g., GaN) is selectively etched as in FIG. 1A to accommodate growth of both red and green QDs at a level that effectively down-converts the LED to produce white light emissions.

Alternatively, the semiconductor material can be selectively etched to include pores of various sizes, as shown in FIG. 1B, 110, 120. For example, a semiconductor material for a blue-LED (e.g., GaN) can be selectively etched as in FIG. 1B to accommodate growth of both red and green QDs at a level that effectively down-converts the LED to produce white light emissions.

Figure 1C:
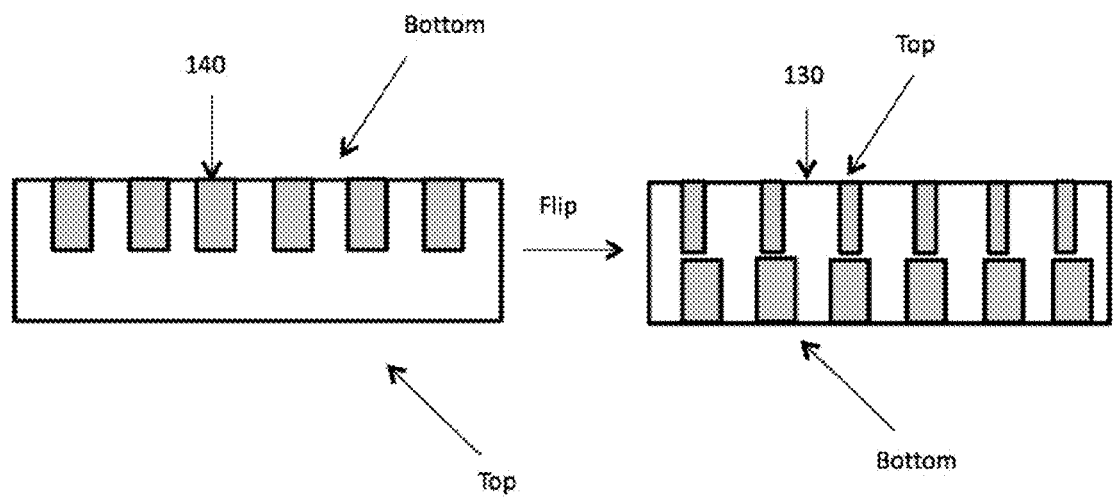

In other embodiments, as illustrated in FIG. 1C, the etching technique produces pores 130 having a small diameter on the top side of a semiconductor material, and pores 140 having a large diameter on the bottom side of the semiconductor material. For example, the bottom side of the semiconductor material can be etched first to a target depth (e.g., halfway) and pore size (e.g., larger diameter). Etching time can control the pore depth, while changing the bias voltage can control the pore size. After etching large pores 140 into the bottom layer, the semiconductor material can be turned over, and small pores 130 can be selectively etched in the top layer to a target depth (e.g., halfway) and pore size (e.g., smaller diameter). Again, etching time and bias voltage can be used to control pore depth and size. According to some embodiments, the small diameter pores 130 are etched to a size that can accommodate growth of green QDs and the large diameter pores 140 are etched to a size that can accommodate growth of red QDs. This pore architecture positions the red QDs below the green QDs to prevent reabsorption of the secondary light emitted by the QDs. In one embodiment, a semiconductor material for a blue-LED (e.g., GaN) is selectively etched as in FIG. 1C to accommodate growth of both red and green QDs at a level that effectively down-converts the LED light to produce white light.

Once the LED semiconductor material is etched to provide pores, QDs are formed within those pores by reacting gas phase QD precursor compounds together within the pores. The precursors may be used to synthesize QDs including, but not restricted to, the following materials: Group II-VI nanoparticles (e.g., CdS, CdSe, ZnS, ZnSe), Group III-V nanoparticles (e.g., InP, GaP), Group II-V nanoparticles (e.g., $Cd_3P_2$), and Group III-VI nanoparticles (e.g., $In_2Se_3$). In one embodiment, suitable gas-phase precursors may include, but are not restricted to, a Group II or Group III cation source, (e.g., $R_2Cd/Zn$; $R_3Ga/In$ (R=organic group)), and a Group V or Group VI anion source, (e.g., $H_2S$, $H_2Se$ or $H_3P$). In yet another embodiment, the flow rate of the gas-phase precursors may be controlled using a carrier gas. The carrier gas may include, but is not limited to, an inert gas (e.g., He, $N_2$ or Ar), or a reducing gas (e.g., $H_2$).

The pores in the semiconductor material allow the gas phase precursors to diffuse throughout the material. The nucleation and growth of QDs from gaseous precursors may proceed in any pores. Furthermore, since QD stability increases with particle size, under suitable reaction conditions particle growth may continue until all the space is occupied. Therefore, the size of the nanoparticles can be restricted by the pore diameter. By way of example only, QDs having an approximately 5 nm diameter can form in approximately 5 nm pores. In one embodiment, QDs having uniform dimensions can grow in the pores. In another embodiment, QDs having variable diameters grow in the pores. In one embodiment, both red and green QDs grow in the pores of a semiconductor material for a blue-LED (e.g., GaN) at a level that effectively down-converts the LED to produce white light emissions. The resulting material is free of liquid solvents because the QD-producing reactions involve only gas phase precursors.

QDs may be prepared by the reaction of gas phase QD precursors as described in N. L. Pickett et al., in *J. Mater. Chem.*, 1997, 7, 1855 and in *J. Mater. Chem.*, 1996, 6, 507. The size of the resultant QDs may be varied by careful control of the reaction conditions (e.g., temperature, time, etc.), and the addition of pyridine in the gas phase. Likewise, the methods used to synthesize QDs in polymer matrices described by Haggata et al. S. W. Haggata et al., *J. Mater. Chem.*, 1996, 6, 1771 and *J. Mater. Chem.*, 1997, 7, 1996 may be adapted to synthesize QDs in the pores of the LED semiconductor material. The Pickett and Haggata references cited in this paragraph are hereby incorporated by reference in their entirety.

Generally, the gas phase QD precursors are exposed to the pores in parallel or counter flow and allowed to react within the pores. In one embodiment, the pores have variable sizes to accommodate both red and green QD growth. In another embodiment, the reaction conditions are controlled to produce both red and green QDs. In yet another embodiment, the QDs may be formed in the semiconductor material at a level that effectively down-converts the semiconductor material to produce white light emissions.

Gas phase reaction conditions can be used to control QD growth within the semiconductor material. For example, pyridine and higher temperatures may be used to inhibit nanoparticle growth as reported by Pickett et al., *Effect of pyridine upon gas phase reactions between $H_2S$ and $Me_2Cd$; control of nanoparticle growth*, J. Mater. Chem., No. 6, 507-09 (1996). Thus, in one embodiment, the gas-phase synthesis can be carried out in the presence of a Lewis base in the gas phase. For example, the Lewis base can coordinate to the surface of the QDs and control their size. Higher concentrations of a Lewis base can be used to synthesize smaller QDs. Suitable Lewis bases may include, but are not restricted to, pyridine gas. In still another embodiment, the semiconductor may comprise a material that may act as a Lewis base. In another embodiment, the reaction may be carried out at a certain temperature. Suitable temperatures may include, but are not restricted to, approximately 25° C. to 200° C. Higher temperatures can be used to produce smaller QDs. In still another embodiment, a Lewis base concentration and temperature are adjusted during gas-phase synthesis in order to synthesize different size QDs within the semiconductor material. In one embodiment, the Lewis base concentration and temperature can be selectively adjusted to a level that results in synthesis of both red and green QDs within the pores of a semiconductor material for a blue-LED (e.g., GaN) at a level that effectively down-converts the LED to produce white light emissions.

In an alternative embodiment, QDs having same size but different wavelength emissions can be grown within the pores of a semiconductor material. For example, nanoparticle precursors can be selected to grow both Group III-V based QDs (e.g. InP, and including graded dots and alloys) and CdSe QDs. InP QDs emitting at a particular wavelength are relatively smaller than CdSe QDs emitting at the same wavelength. Thus, in an embodiment, InP and CdSe QDs can grow to the same size but emit different wavelengths. In one embodiment, the InP and CdSe QDs grow within pores having uniform diameter, wherein the InP QDs emit red light and the CdSe QDs emit green light. In an embodiment, the concentration of precursors for red-emitting QDs and green-emitting QDs can be selectively adjusted to a level that results in synthesis of both red and green QDs within the pores of a semiconductor material for a blue-LED (e.g., GaN) at a level that effectively down-converts the LED to produce white light emissions.

Figure 2:
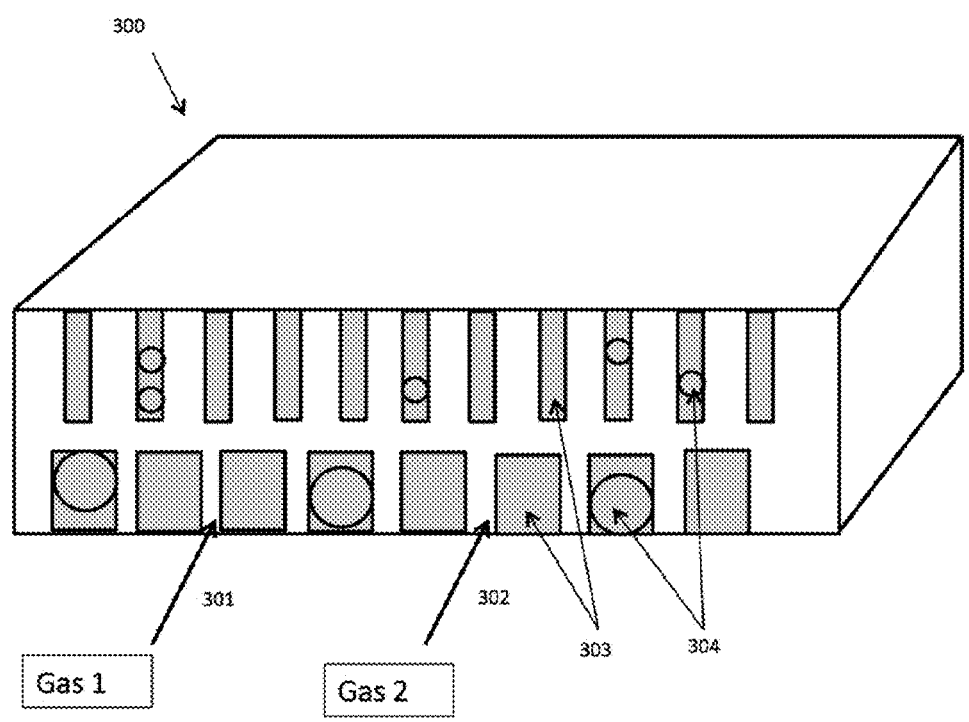
FIG. 2 shows the formation of QDs within pores of a semiconductor material from gaseous precursors provided with counter current gas streams.

In one embodiment, a porous semiconductor material 200 is placed in the middle of two streams of gas flowing from opposite directions, 201 and 202, respectively, as illustrated in FIG. 2. The gas streams can include precursors to QDs 204. Referring to FIG. 2, as the gas streams flows through the semiconductor material 200, nanoparticle nucleation and growth may ensue in the material's pores 203. Nanoparticle sizes can be restricted by the size of the pores 203 they grow in. In an alternative embodiment, nanoparticle sizes may be restricted by reaction conditions, including adjustment to Lewis base concentration and/or temperature. In an embodiment, the precursor gas streams flow in an alternating pattern. In another embodiment, the precursor gas streams flow simultaneously.

Figure 3:
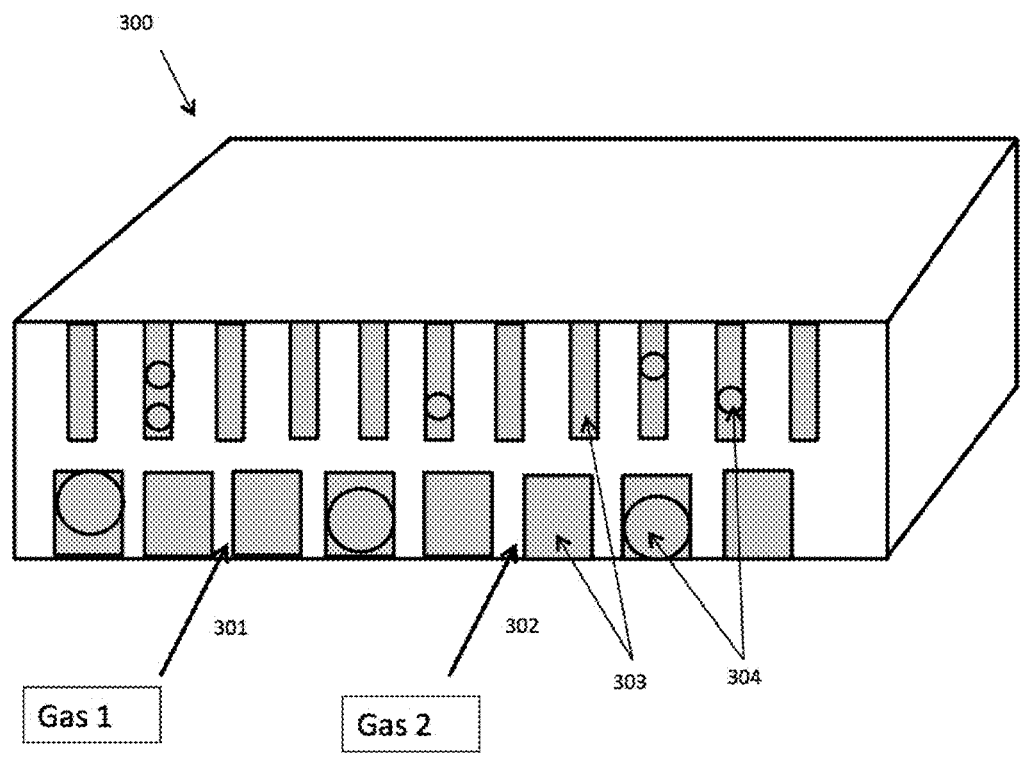
FIG. 3 shows the formation of QDs within pores of a semiconductor material from gaseous precursors provided with parallel gas streams.

In another embodiment, a porous semiconductor material 300 is placed in the stream of two parallel gas sources 301, 302, as illustrated in FIG. 3A. The gas streams may be allowed to flow either sequentially or in tandem. As in the method described in FIG. 2, the gas streams can include precursors to QDs 304. As illustrated in FIG. 3, as the gas streams flow through the semiconductor material 300, nanoparticle nucleation and growth may ensue in the material's pores 303. Again, nanoparticle sizes can be restricted by the size of the pores 303 they grow in. In an alternative embodiment, nanoparticle sizes may be restricted by reaction conditions, including adjustment to Lewis base concentration and/or temperature. In an embodiment, the precursor gas streams flow in an alternating pattern. In another embodiment, the precursor gas streams flow simultaneously.

Figure 4:
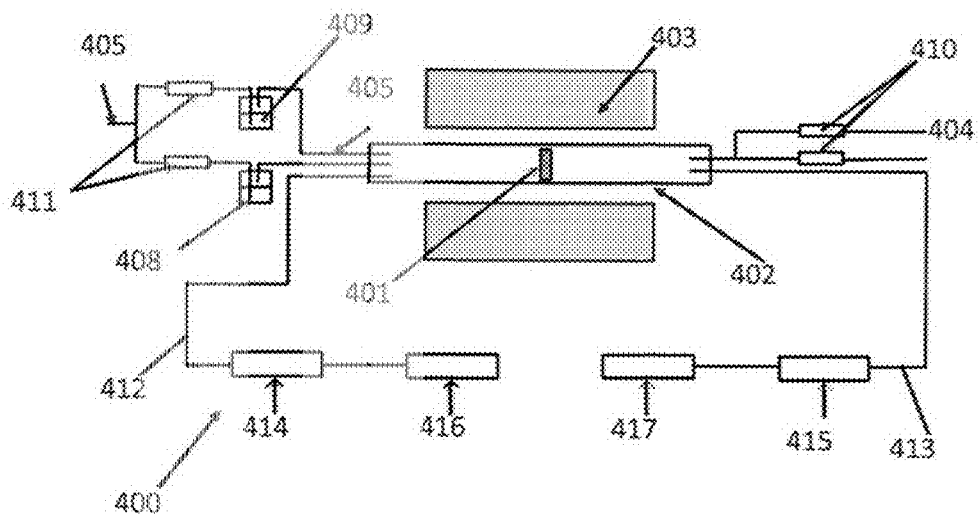
FIG. 4 illustrates an apparatus for providing counter-current flow of QD precursor gases.
Figure 5:
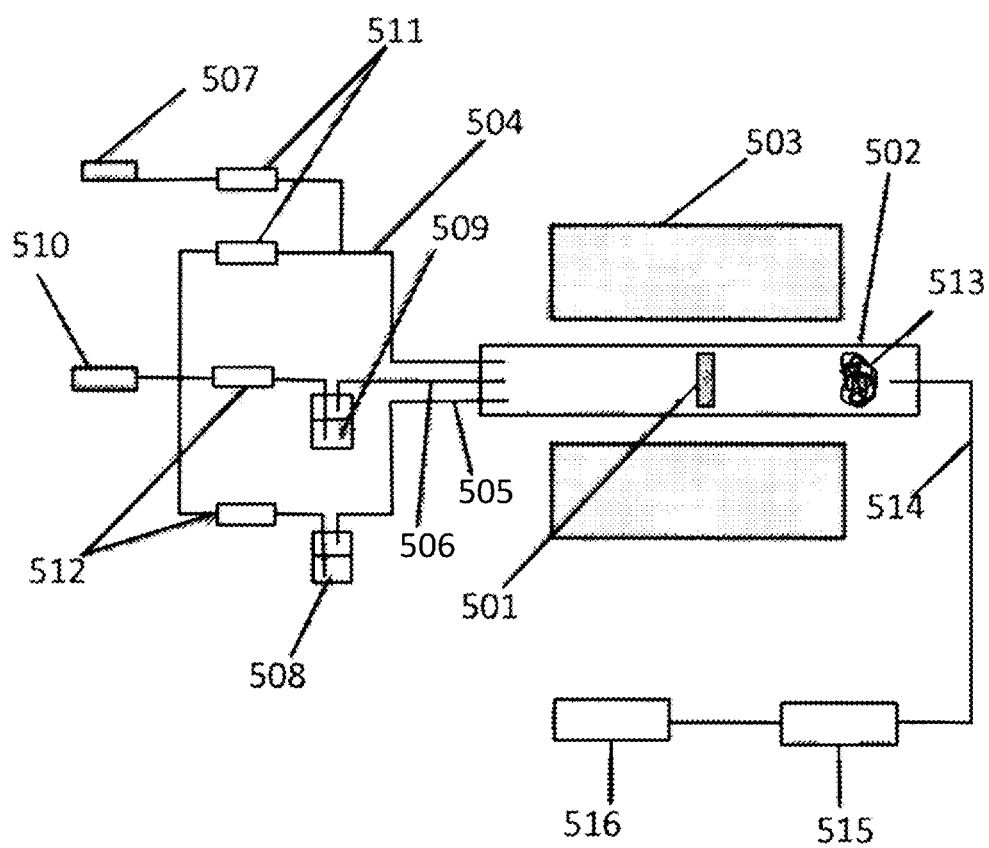
FIG. 5 illustrates an apparatus for providing parallel flow of QD precursor gases.

FIGS. 4 and 5 illustrate embodiments of apparatuses for the gas-phase synthesis of QDs. In the apparatus 400 illustrated in FIG. 4A, a semiconductor material 401 is inserted into a quartz tube 402, which is then positioned in a tube furnace 403. QD precursor gasses are provided by lines 404 and 405 to opposite sides of the semiconductor material. The gas streams can flow simultaneously or in an alternating pattern. For example, line 404 may provide a gas phase QD precursor such as $H_2S$, $H_2Se$, or $PH_3$, and line 405 may provide a QD precursor such as $R_2Zn$, $R_2Cd$, $R_3Ga$ or $R_3In$. Apparatus 400 can also include lines 406 and 407 for carrier gasses. Apparatus 400 may also include a source 408 for providing a Lewis base. Precursor gas lines may include a reactor 409 for generating gaseous precursors. Any or all of the gas lines may be provided with gas-flow meters 410 and 411. Exhaust lines 412 and 413 may be provided with scrubbers 414 and 415, respectively, and with pressure controllers 416 and 417 respectively.

In the apparatus 500 illustrated in FIG. 5, a semiconductor material 501 is positioned into a quartz tube 502, which is positioned in tube furnace 503. The semiconductor material is exposed to parallel streams of QD precursor gas provided by lines 504 and 505. The gas streams can flow simultaneously or in an alternating pattern. The apparatus may also include one or more lines 506 providing additional reagents, such as a Lewis base. Lines 504 and 505 are connected to sources of QD precursor gasses 507 and 508, respectively. In apparatus 500, line 506 can be connected to a source of Lewis base 509. As in the apparatus illustrated in FIG. 4, example precursor gasses for apparatus 500 include $H_2S$, $H_2Se$, or $PH_3$, and $R_2Zn$, $R_2Cd$, $R_3Ga$ or $R_3In$. Any of the gas lines can also be provided with a source of carrier gas 510 and additional equipment, such as gas-flow meters 511 and 512. Quartz tube 502 may contain glass wool 513 up stream of exhaust line 514. Exhaust line 514 may be equipped with monitoring, control, or processing equipment, such as one or more scrubbers 515 and pressure controller 516.

The particular set-ups illustrated in FIGS. 4 and 5 are exemplary and schematic only. It will be readily apparent to one of skill in the art how to implement these and other geometries for providing QD precursor gasses to a semiconductor material, as described herein. The scope of the invention is not limited to any particular reactor geometry or apparatus.

Figure 6:
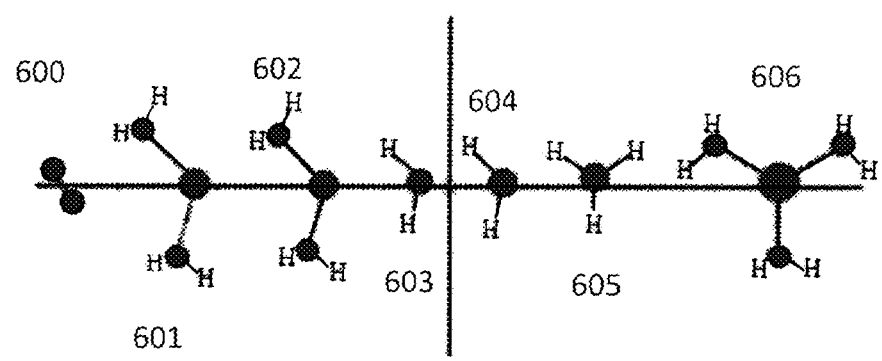
FIG. 6 is a diagram comparing the relative size of an oxygen molecule to gas-phase precursor molecules of QDs.

The methods and apparatuses described herein can grow QDs within a semiconductor material because gas phase QD precursors can diffuse into nano-size pores and react inside those pores. FIG. 6 compares the relative size of QD precursor molecules $Me_2Cd$ 601, $Me_2Zn$ 602, $H_2S$ 603, $H_2Se$ 604, $PH_3$ 605, and $InMe_3$ 606 to the size of $O_2$ 600.

Figure 7A:
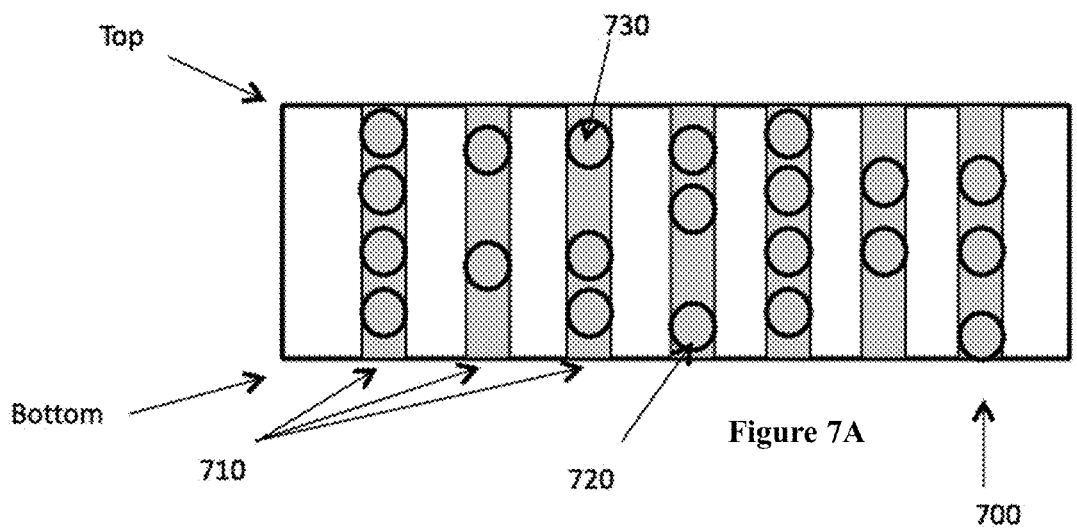
FIGS. 7A-7C illustrate the formation of QDs within pores selectively etched into a semiconductor material.
Figure 7B:
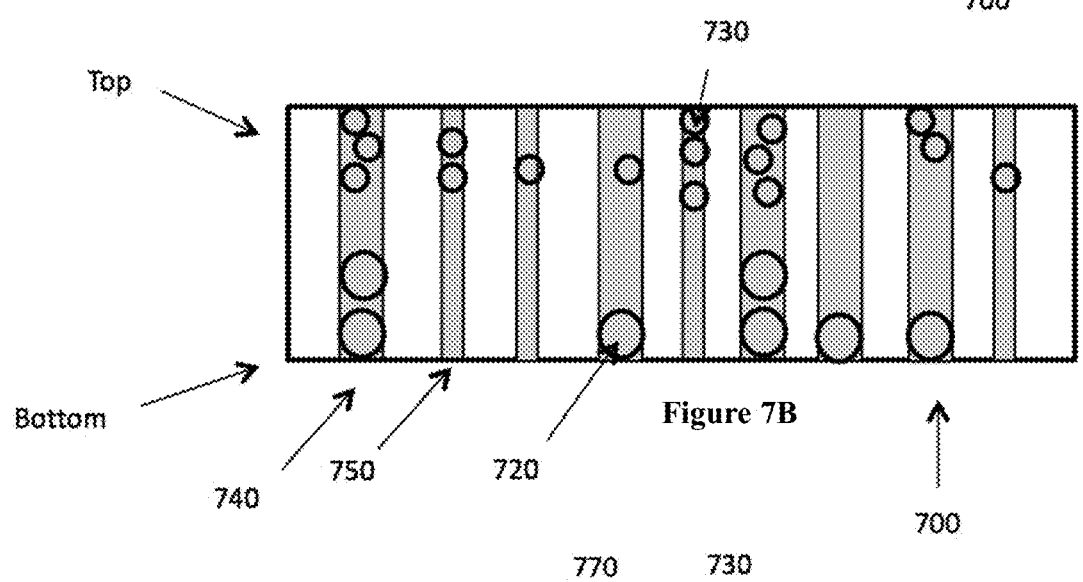
Figure 7C:
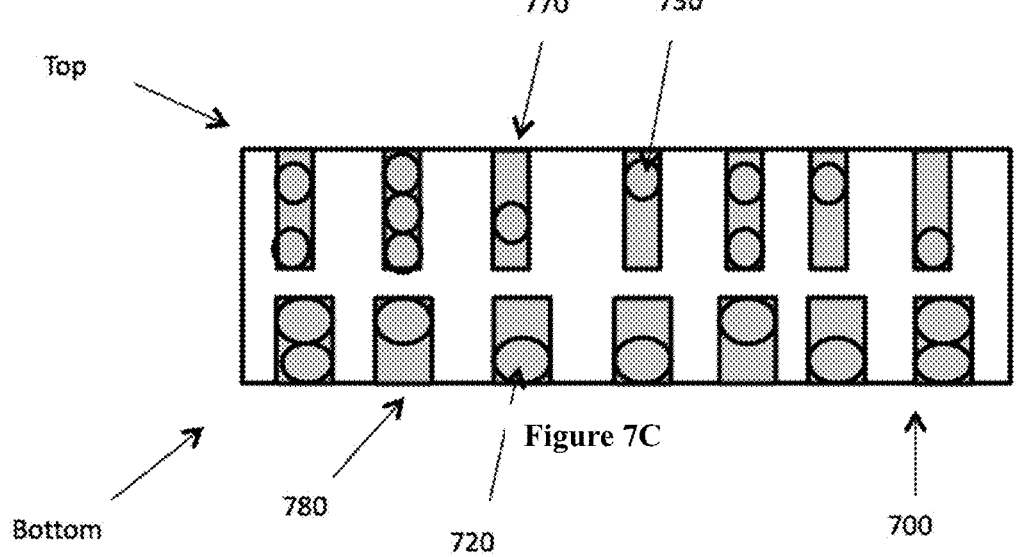

FIGS. 7A-7C illustrate the formation of QDs within pores selectively etched into a semiconductor material 700. Gaseous QD precursors can diffuse into pores as small as 1 nm in width or less. The QD precursors react within the pores to form QDs 702. In wider pores 703, the precursors react to form larger diameter QDs 702a. In one embodiment, these larger diameter QDs 702a can emit light that is red-shifted. In narrower pores 704, smaller diameter QDs 702b can form. In another embodiment, these smaller QDs 702b can emit green-shifted light.

Referring to FIG. 7A, QDs can be grown in a semiconductor material 700 having pores with uniform diameter 710 (FIG. 1A). In another embodiment, as illustrated in FIG. 7B, QDs can be grown in a semiconductor material 700 having pores with different diameters 740, 750 (FIG. 1B). In still another embodiment, as illustrated in FIG. 7C, QDs can be grown in a semiconductor material 700 having pores with a small diameter 770 in the top half of the semiconductor material and a large diameter 780 in the bottom half of the semiconductor material (FIG. 1C).

The QD precursors can diffuse into the pores and grow to a size that fills the diameter of the pores. In one embodiment, the gaseous precursors include nanoparticle precursors to produce both red 720 and green QDs 730 within the uniform-sized pores. For example, the gas may include precursors for Group III-V based QDs (e.g. InP, and including graded dots and alloys) and CdSe QDs, which will emit different wavelengths at a certain size. In an alternative embodiment, adjusting Lewis base concentration and/or temperature during synthesis can be used to selectively control QD size. In one embodiment, reaction conditions are controlled to grow red-emitting QDs 720 in the bottom half of the semiconductor material, and green-emitting QDs 730 in the top half of the semiconductor material. In yet another embodiment, green and red-emitting QDs are grown within a blue-light emitting semiconductor material having uniform pore diameter at a level that effectively down converts the semiconductor material to white light emissions.

Figure 8:
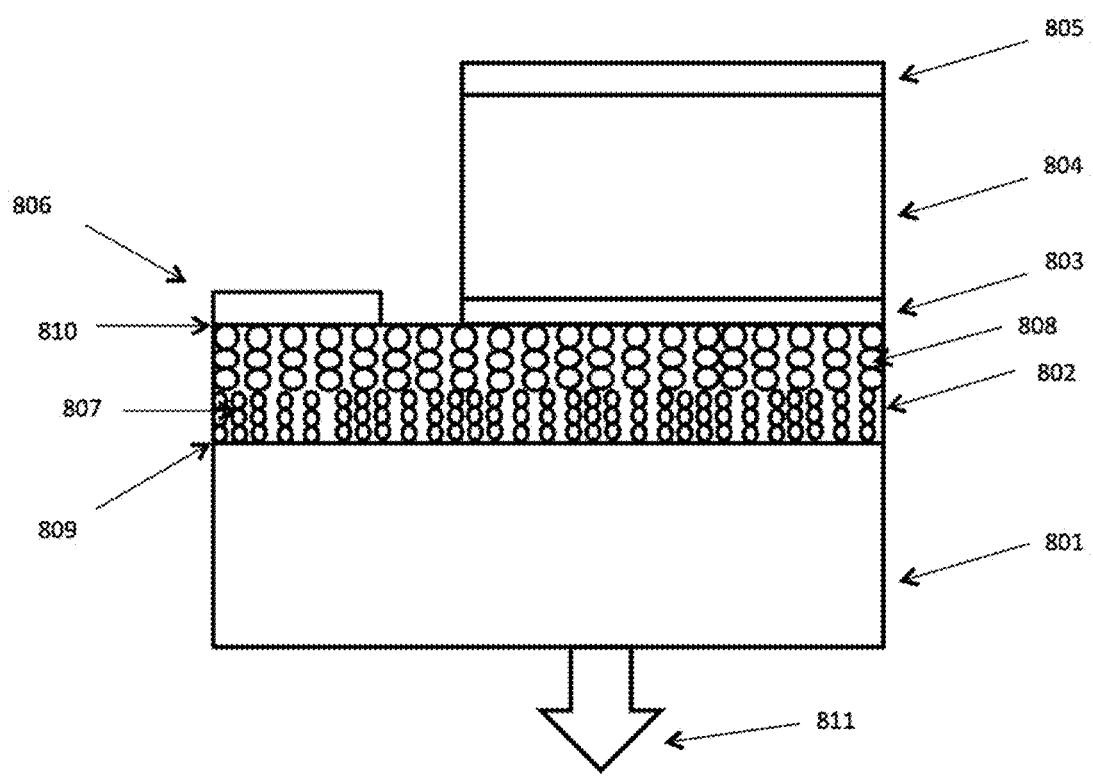
FIG. 8 illustrates a conventional LED having nanoparticles embedded within a porous n-GaN layer.

In yet another embodiment, as illustrated in FIG. 8, a conventional LED can include a selectively etched n-GaN layer with nanoparticles embedded in its pores. The LED may include a Sapphire Substrate 801, an n-GaN layer 802, a p-n junction active layer 803, a p-GaN layer 804, a p-electrode 805, and an n-electrode 806. In one embodiment, both green 807 and red-emitting QDs 808 can be embedded in the n-GaN pores. In another embodiment, green-emitting QDs 807 are embedded in the top half 809 of the n-GaN layer and red-emitting QDs 808 are embedded in the bottom half 810 of the n-GaN layer. Any of these designs can be achieved with one or more of the aforementioned methods. In still another embodiment, the QDs are embedded in the n-GaN layer with a design and at a level that results in down-converting the LED to a substantially white light emission 811.

The present application presents numerous advantages over the prior art. It relies on gaseous precursors, which though larger than individual oxygen and water molecules, are of the same order of magnitude. As illustrated in FIG. 6, the gaseous precursors suggested herein are less than three times the length of an oxygen molecule (~3 Å) along their longest axis, which enables them to diffuse into pores less than 1 nm in diameter, i.e. below the lower limit for QD stability. As shown in FIGS. 7A-7C, if a pore is large enough such that it corresponds to a diameter within the stable QD range, nanoparticle formation may proceed. Furthermore, gaseous precursors are able to penetrate the entire semiconductor material layer. And unlike prior art techniques such as high pressure nitrogen adsorption, the embodiments herein do not assume and rely on cylindrical pores. The techniques herein can be used to formulate QDs in any pore shape. Furthermore, with the methods and apparatuses described herein, cryogenic temperatures, which may be damaging to LEDs and may be challenging and costly to maintain, are not required. Moreover, the semiconductor need not be exposed to potentially damaging high pressures. Consequently, the method does not introduce defects into the semiconductor material during gas-phase synthesis. Furthermore, since the nanoparticle size may be controlled by a number of parameters, including temperature, time, carrier gas, and the concentration of an optional Lewis base, the technique may be adapted for use with a wide range of semiconductor materials, including those used in LEDs.

It's understood that the above description is intended to be illustrative, and not restrictive. The material has been presented to enable any person skilled in the art to make and use the inventive concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

EXAMPLES

Example 1

CdS

CdS QDs may be formed from the gas phase reaction of helium gas streams containing $Me_2Cd$ and $H_2S$ in the presence of pyridine gas. Typical reaction conditions include a He flow rate of ~600 cm$^3$ min$^{-1}$ and a 30-fold excess of H$_2$S to Me$_2$Cd. The particle size may be controlled by varying the pyridine concentration and/or the reaction temperature. Preferably, pyridine:Me$_2$Cd ratios in the range 1:20 to 2:1, and temperatures between room temperature and 200° C. are employed. It has been found that increasing the pyridine concentration reduces the particle size, while the particle size increases with increasing temperature.

The absorption of the CdS nanoparticles may be tuned from the UV to cyan (bulk band gap ~512 nm) depending on the particle size. For example, nanoparticles in the size range 2-20 nm may be expected to emit between approximately 320-500 nm, corresponding with UV to cyan light.

Example 2

CdSe

Reaction conditions similar to those outlined for CdS (above) may be used to synthesize CdSe QDs [N. L. Pickett et al., *J. Mater. Chem.*, 1997, 7, 1855], substituting H$_2$S for H$_2$Se. Higher pyridine concentrations may be used to control the particle size (up to 150:1 pyridine:Me$_2$Cd).

The absorption of the CdSe nanoparticles may be tuned from the blue to the deep red (bulk band gap ~717 nm) depending on the particle size. Nanoparticles in the size range 2-20 nm may be expected to emit between approximately 490-700 nm, corresponding with blue to deep red light.

Example 3

ZnS

Reaction conditions similar to those outlined for CdS (above) may be used to synthesize ZnS QDs [N. L. Pickett et al., *J. Mater. Chem.*, 1997, 7, 1855], substituting Me$_2$Cd for Me$_2$Zn. Higher reaction temperatures (up to 300° C.) may be advantageous.

The absorption of the ZnS nanoparticles may be tuned across the UV spectrum (bulk band gap ~344 nm) depending on the particle size. Nanoparticles in the size range 2-20 nm may be expected to emit between approximately 235-340 nm.

Example 4

ZnSe

Reaction conditions similar to those outlined for ZnS (above) may be used to synthesize ZnSe QDs [N. L. Pickett et al., *J. Mater. Chem.*, 1997, 7, 1855], substituting H$_2$S for H$_2$Se. A reducing H$_2$ carrier gas, rather than inert He, may be more effective at controlling the particle size.

The absorption of the ZnS nanoparticles may be tuned from the UV to the blue (bulk band gap ~459 nm) depending on the particle size. Nanoparticles in the size range 2-20 nm may be expected to emit between approximately 295-455 nm, corresponding with UV to indigo light.

Example 5

InP

InP nanoparticles may be synthesized using a reaction procedure similar to those outlined for II-VI QDs (above) from Me$_3$In and PH$_3$ gaseous precursors.

The absorption of the InP nanoparticles may be tuned from the green to the near-IR (bulk band gap ~925 nm) depending on the particle size. Nanoparticles in the size range 2-20 nm may be expected to emit between approximately 520-875 nm, corresponding with green light to IR radiation.

What is claimed is:

1. A composition comprising:
   a light-emitting semiconductor material having pores therein, the pores comprising:
   first pores having first pore diameters; and
   second pores having second pore diameters larger than the diameters of the first pores;
   first color-emitting quantum dots (QDs) disposed within the first pores and having diameters essentially equal to the first pore diameters; and
   second color-emitting QDs disposed within the second pores and having diameters essentially equal to the second pore diameters; wherein
   the composition is free of solvent.

2. The composition of claim 1, wherein the pores are about 1 nm to about 20 nm in diameter.

3. The composition of claim 1, wherein the light-emitting semiconductor material comprises as GaN, AlGaAs, AlGaInP, or AlGaInN, or any derivatives thereof.

4. The composition of claim 1, wherein the QDs comprise a semiconductor material selected from CdS, CdSe, ZnS, ZnSe, InP, GaP, Cd$_3$P$_2$ and In$_2$Se$_3$.

5. The composition of claim 1, wherein at least one of the first and second color-emitting QDs emit green light when illuminated by light from the light-emitting semiconductor.

6. The composition of claim 1, wherein at least one of the first and second color-emitting QDs emit red light when illuminated by light from the light-emitting semiconductor.

7. A light emitting device, comprising:
   a light-emitting semiconductor material having pores therein, the pores comprising:
   first pores having first pore diameters; and
   second pores having second pore diameters larger than the diameters of the first pores;
   first color-emitting quantum dots (QDs) disposed within the first pores and having diameters essentially equal to the first pore diameters; and
   second color-emitting QDs disposed within the second pores and having diameters essentially equal to the second pore diameters; wherein
   the light-emitting semiconductor material is free of solvent.

8. The device of claim 7, wherein the pores are about 1 nm to about 20 nm in diameter.

9. The device of claim 7, wherein the light-emitting semiconductor material comprises as GaN, AlGaAs, AlGaInP, or AlGaInN, or any derivatives thereof.

10. The device of claim 7, wherein the QDs comprise a semiconductor material selected from CdS, CdSe, ZnS, ZnSe, InP, GaP, Cd$_3$P$_2$ and In$_2$Se$_3$.

11. The device of claim 7, wherein at least one of the first and second color-emitting QDs emit green light when illuminated by light from the light-emitting semiconductor.

* * * * *